United States Patent
Yang et al.

(10) Patent No.: US 8,667,321 B2
(45) Date of Patent: Mar. 4, 2014

(54) CONTROLLING METHOD AND CONTROLLER FOR MEMORY

(75) Inventors: Steve Wiyi Yang, Hsinchu Hsien (TW); Chien-Yi Chen, Taipei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 239 days.

(21) Appl. No.: 13/178,602

(22) Filed: Jul. 8, 2011

(65) Prior Publication Data

US 2012/0266031 A1    Oct. 18, 2012

(30) Foreign Application Priority Data

Apr. 14, 2011 (TW) .................................. 100113011

(51) Int. Cl.
*G06F 11/00* (2006.01)
(52) U.S. Cl.
USPC ............................................. 714/6.1; 714/22
(58) Field of Classification Search
USPC ............... 714/6.1, 6.11, 22, 24, 34, 38.13, 42
See application file for complete search history.

(56) References Cited

U.S. PATENT DOCUMENTS

| | | | |
|---|---|---|---|
| 5,577,195 A * | 11/1996 | Gochi .............................. | 714/22 |
| 5,664,089 A * | 9/1997 | Byers et al. .................... | 714/14 |
| 6,263,453 B1 * | 7/2001 | Anderson ....................... | 714/22 |
| 6,711,701 B1 * | 3/2004 | Roohparvar et al. ........... | 714/24 |
| 6,988,222 B2 * | 1/2006 | Sparer .............................. | 714/22 |
| 7,227,803 B2 * | 6/2007 | Lee et al. ....................... | 365/228 |
| 7,747,887 B2 * | 6/2010 | Shipton et al. ................. | 713/340 |
| 2008/0089162 A1 * | 4/2008 | Makela et al. ................. | 365/228 |
| 2009/0049222 A1 * | 2/2009 | Lee et al. ....................... | 710/300 |
| 2009/0106570 A1 * | 4/2009 | Yoon .............................. | 713/300 |
| 2009/0240884 A1 * | 9/2009 | Chen et al. ..................... | 711/115 |

FOREIGN PATENT DOCUMENTS

TW       201003399 A       1/2010

OTHER PUBLICATIONS

Taiwan Office Action, Oct. 8, 2013, 7 pages.

* cited by examiner

*Primary Examiner* — Marc Duncan
(74) *Attorney, Agent, or Firm* — Edell, Shapiro & Finnan, LLC

(57) ABSTRACT

A memory controller including a detection module and a protection module is provided. The memory controller is applicable to a memory having a command transmission port and a data transmission port. The detection module detects whether an error condition occurs in an electronic device associated with the memory. When the error condition is detected, the protection module sends an interrupt command to the memory via the command transmission port to stop an operation associated with the data transmission port.

17 Claims, 3 Drawing Sheets

CONTROLLING METHOD AND CONTROLLER FOR MEMORY

This application claims the benefit of Taiwan application Ser. No. 100113011, filed Apr. 14, 2011, the subject matter of which is incorporated herein by reference.

BACKGROUND OF THE INVENTION

1. Field of the Invention

The invention relates to a memory, and more particularly, to a method for protecting data stored in a memory from unexpected events.

2. Description of the Related Art

In various modern electronic devices, such as digital cameras, laptop computers and handheld game consoles, a pluggable memory card plays an essential part as it not only flexibly augments storage spaces but also imparts high mobility to digital data. Apart from storing user data, a memory card is often utilized for storing software data or file systems of the memory. For example, a file system in a memory card may be in a file allocation table (FAT) format, such as the FAT32 format, or a New Technology File System (NTFS) format. Since a file system is utilized for recording corresponding physical locations of all sorts of files in a physical device, any damage to the file system may result in an external circuit from being unable to access the data stored in the memory card. Therefore, it is crucial to ensure intactness and correctness of data in a memory card under all conditions.

When a memory card is actually utilized, data stored in the memory card is often damages by unexpected events. For example, if an abnormal power failure or undervoltage occurs when an external circuit writes data into the memory, the data written into the memory and/or data previously stored in the memory can be damaged. Such damage may be a result of corresponding errors in a storage medium, inadequate error handling processes in the memory card, or inherent features of the internal storage medium (e.g., a flash memory) of the memory card.

When an error occurs in a logical or physical space of the storage medium in the memory card, data disorder of the data in the memory card will likely occur. Error handling is generally handled by firmware in the memory card. However, a flaw in a firmware program in the memory card may cause a disorder of the firmware, leading to data loss or even a permanent inaccessibility of the memory card in an abnormal power failure. Furthermore, inherent features of the storage medium in the memory card may also be factors that lead to errors in the memory card in an abnormal power failure. For example, in a multi-level cell (MLC) storage medium such as that employed in a flash memory, when an error occurs in data at one location, data damage owing to a corresponding paired location error is much more likely to occur.

In view of the above situations, the prior art has proposed remedial measures after an unexpected power failure has taken place; however, such errors are in fact better to be prevented in the first instance rather than fixed afterward.

SUMMARY OF THE INVENTION

The invention is directed to a control method and controller for a memory. When an unexpected event takes place, the method and controller of the present invention are configured to immediately notify the memory to stop reading or writing operations, so as to reduce or even entirely prevent damage to data stored in the memory by the unexpected event, so as to optimize reliability of an electronic device and the memory card.

According to an embodiment of the present invention, a memory controlling method is provided. The memory comprises a command transmission port, and a data transmission port. The method comprises steps of detecting whether an error condition occurs in an electronic device associated with the memory, and transmitting an interrupt command via the command transmission port to the memory when the error condition is detected in the electronic device, so as to stop an operation associated with the data transmission port.

According to another embodiment of the present invention, a memory controller comprising a detection module and a protection module is provided. The memory comprises a command transmission port, and a data transmission port. The detection module detects whether an error condition occurs in an electronic device associated with the memory. When the error condition is detected in the electronic device, the protection module sends an interrupt command to the memory via the command transmission port to stop an operation associated with the data transmission port.

Different from solutions provided by the prior art that implement remedial measures after data is already damaged, a goal of the method and controller of the present invention is to prevent or reduce the possibility of data being damaged in the first instance.

The above and other embodiments of the invention will become better understood with regard to the following detailed description of the preferred but non-limiting embodiments. The following description is made with reference to the accompanying drawings.

DETAILED DESCRIPTION OF THE INVENTION

Figure 1A:
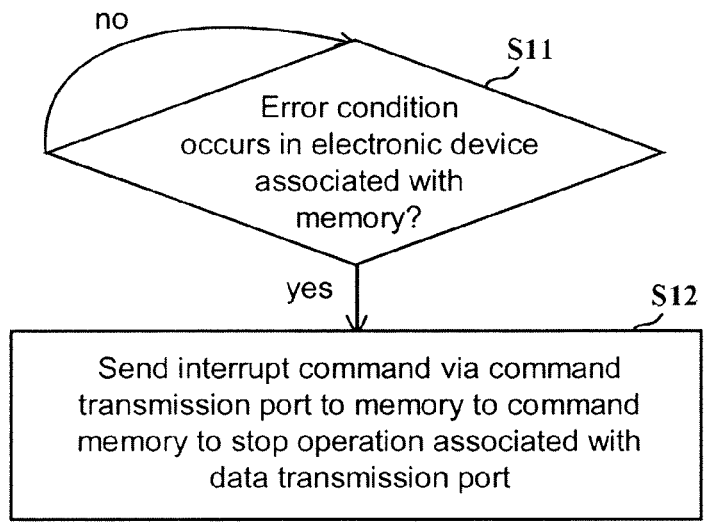
FIG. 1(A) and FIG. 1(B) are flowcharts of a memory controlling method according to an embodiment of the present invention.

FIG. 1(A) shows a flowchart of a memory controlling method according to an embodiment of the present invention. The method is applicable to a memory comprising a command transmission port and a data transmission port different from the command transmission port. For example, the memory can be a secure digital (SD) card comprising a command transmission pin and four data transmission pins. An external controller is allowed to send read, write and delete commands to the memory via the command transmission port; whereas data read from or written to the memory is transmitted via the data transmission port.

In this embodiment, the method begins with Step S11 to detect whether an error condition occurs in an electronic device associated with the memory. As an example, the electronic device is a mobile phone, and the memory is a memory card plugged into the mobile phone. In this embodiment, Step S11 is realized by utilizing a voltage detector coupled to an output of a battery of the mobile phone to detect whether a corresponding supply voltage is within a normal range. Once an overvoltage or an undervoltage is detected, a determination result in Step S11 shows that an error condition occurs in the electronic device. For example, the error condition may be an unstable voltage due to the aging of the battery or a disengagement from the mobile phone due to an accidental dropping of the mobile phone, causing the determination result in Step S11 to be affirmative, i.e., an error condition in the electronic device is detected.

In practice, a mechanical sensor such as a spring plate may be utilized in Step S11 to detect whether the battery deviates from its normal position, or whether an external protecting cover of the battery is opened. As another example, Step S11 may also be set to detect whether a crash of an operating system of the electronic device occurs. Furthermore, the above detection conditions may be simultaneously (or selectively) included in Step S11, inferring that the determination result in Step S11 is affirmative as long as one of the detection conditions is true. In practice, Step S11 may be performed periodically or continuously.

As shown in FIG. 1(A), the method proceeds to Step S12 when the determination result in Step S11 is affirmative. In Step S12, an interrupt command is sent to the memory via the command transmission port of the memory for stopping an operation associated with the data transmission port. For example, the interrupt command can be a stop reading and writing command, a memory stop command, or other predetermined commands defined by a manufacturer of the memory card, so as to prevent the memory card from continuing reading and writing procedures without sufficient power supply. Taking an SD card as an example, when an external circuit writes data into the memory, a controller of the memory card may send a stop transmission command to the memory card via its command transmission pin. Upon receiving the stop transmission command, the SD card immediately stops the reading or writing operation originally performed.

A procedure of reading from and writing to the memory card is generally a series of operations, once which are initiated, data transmission starts to take place between the electronic device and the memory card until a predetermined amount of data has been transmitted. Unless an interrupt command is sent via the command transmission port as previously described, the scheduled data transmission procedure continues despite the fact that a removal of the battery or unstable power is discovered by a system of the electronic device. With an operation of Step S12 that immediately stops the operation associated with the data transmission port, damage possibly resulting from continuing writing or reading data can be effectively reduced or even entirely prevented. For example, supposing an error condition occurs when a last part of data is written during the transmission of a predetermined amount of data, the operation of Step S12 effectively secures the transmitted data prior to the last part of data to prevent an access failure to all the data previously written to the memory card. Moreover, the operation of Step S12 is capable of effectively preventing data damage at a paired location of an MLC in a flash memory, for example. Since the data at the paired location may be internal firmware or a file system, a corresponding damage may lead to a data loss or a permanent damage of the memory card. In other words, the present invention is also capable of further preventing damage of the memory or a data loss that may result in permanent inaccessibility to the data previously stored in the memory.

Figure 1B:
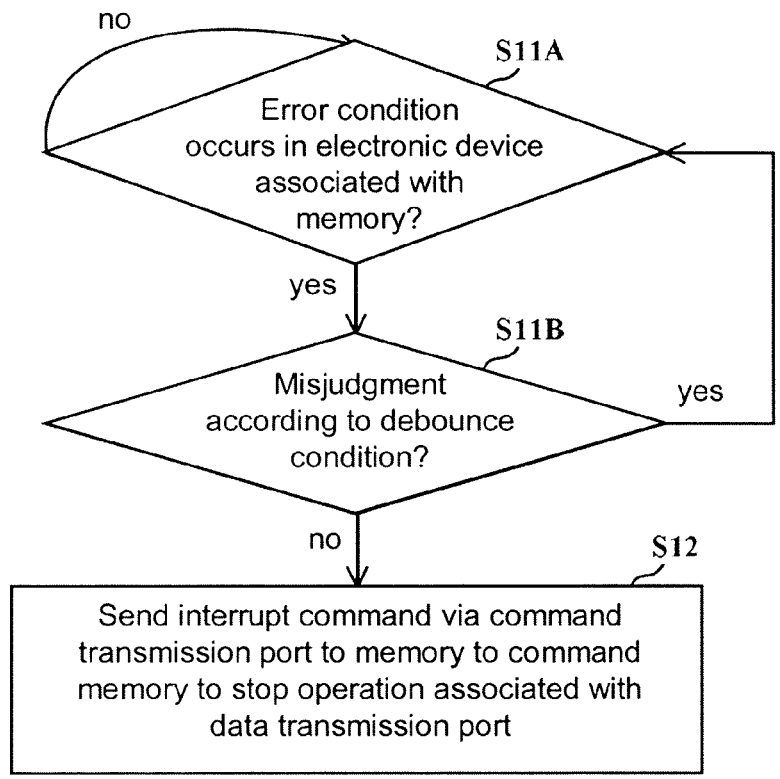

According to another embodiment of the present invention, the above control method may further comprise detecting the error condition according to a debounce condition. As shown in FIG. 1(B), Step S11 is divided into two sub-steps. In Sub-step S11A, detecting whether an error condition occurs in an electronic device associated with the memory; in Sub-step S11B, it is further determined whether a detection result in Sub-step S11A is a misjudgment. For example, a detection condition in Sub-step S11A may be whether a battery voltage of the electronic device is lower than a predetermined threshold, and Sub-step S11B may be determining whether the voltage is lower than the threshold for a predetermined period. Thus, the control method enters Step S12 only when a determination result in Sub-step S11b is negative. That is to say, operations of the memory stay unaffected if a deviation of the battery voltage turns out to be unstable surges which present only within an extremely short time. Under such circumstances, the memory need not be notified by the external control circuit to stop operating.

In practice, the debounce condition in Sub-step S11A may be designed to be related to a power supply feature of the electronic device. For example, with a known feature that an output voltage of the electronic device varies with a lifespan of the battery thereof, the above debounce condition may be designed to be associated with such feature. Furthermore, Step S12 may comprise a sub-step for determining a sending time, at which the interrupt command is sent via the command transmission port. For example, the sending time for sending the interrupt command may be set as after a predetermined packet is completely transmitted or written into the memory, rather than sent immediately, so as to balance between the instantaneousness of interruption and intactness of data transmission.

Figure 2:
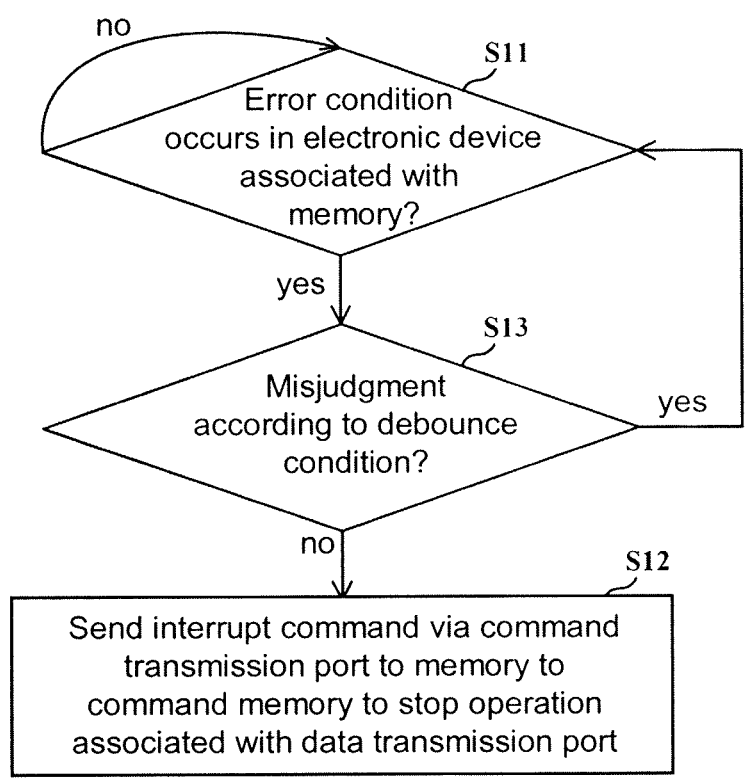
FIGS. 2 and 3 are flowcharts of a memory controlling method according to two other embodiments of the present invention.

FIG. 2 shows a flowchart of a memory controlling method according to another embodiment of the present invention. In this embodiment, the memory controlling method further comprises Step S13 between Step S11 and Step S12. When a determination result in Step S11 is affirmative, the method proceeds to Step S13 to determine whether the operation associated with the data transmission port of the memory is under execution. If a determination result in Step S13 is negative, Step S12 is performed, transmitting an interrupt command to the memory. On the contrary, when the determination result in Step S13 is affirmative, it means that data in the memory will stay intact even when the error condition occurs in the electronic device, such that Step S12 is not performed. Please note that Step S13 is an optional step in the memory controlling method, and whether to include Step S13 in the memory controlling method may be determined according to features and communication approaches between the electronic device and the memory.

Figure 3:
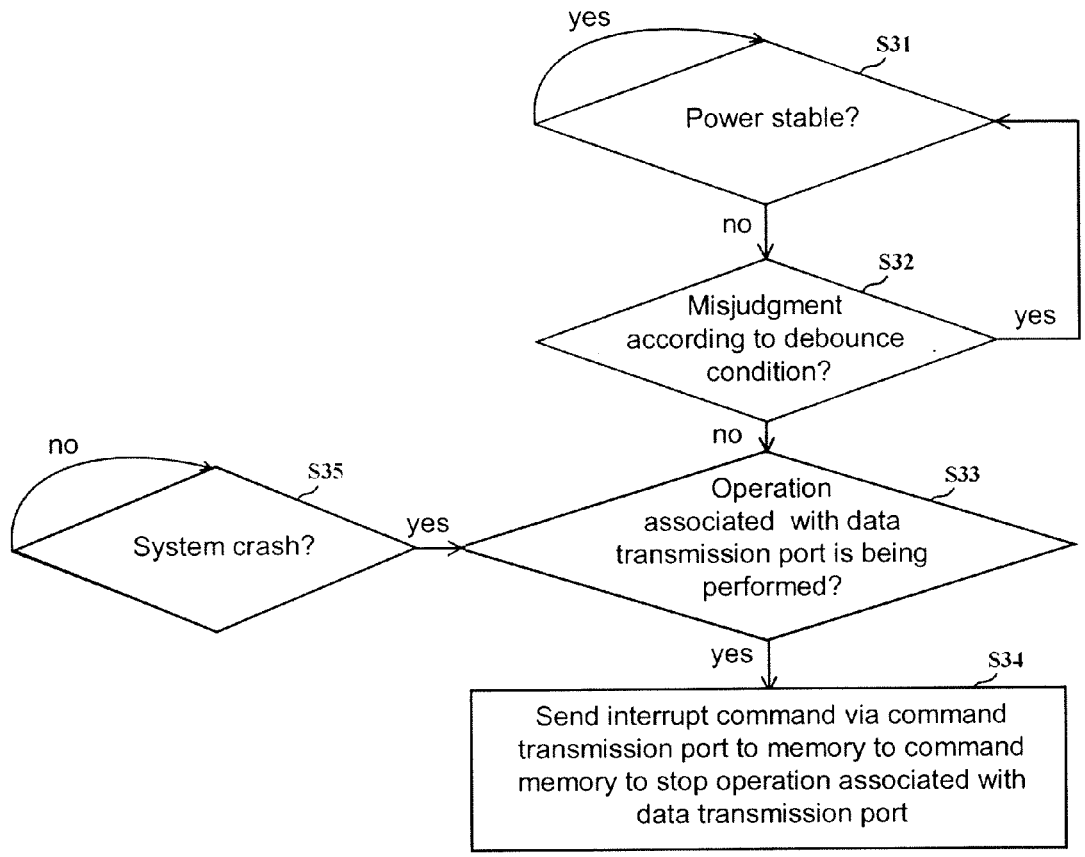

FIG. 3 shows a flowchart of a memory controlling method according to yet another embodiment of the present invention. In this embodiment, detections regarding stabilities of both a power supply and an operating system are included. In Step S31, it is detected whether a power of the electronic device associated with the memory is stable. When a determination result in Step S31 is negative, Step S32 is performed to determine whether a deemed unstable power is a result of misjudgment according to a debounce condition. Only when a determination result in Step S32 is negative, Step S33 is performed to determine whether the operation associated with the data transmission port of the memory is under execution. When a determination result in Step S33 is affirmative, Step S34 is performed to send an interrupt command via the command transmission port of the memory, for stopping the operation. As shown in FIG. 3, in Step S35, it is determined whether the operating system of the electronic device has crashed. The method proceeds to Step S33 when a determination result in Step S35 is affirmative. For system crashes, an operating system of an electronic device is generally designed with a watchdog program, which automatically reboots the electronic device when the operating system is incapable of operating for a predetermined period. Under such situations, the abovementioned data damage resulting from a sudden power failure may also happen supposing the data transmission is taking place between the electronic device and the memory during the reboot. However, according to this embodiment of the present invention, a determination step of Step S35 is provided to prevent the above situation. That is to say, possibilities that data stored in the memory may be damaged are significantly lowered, whether there is an abnormality of a power supply or of an operating system.

Figure 4:
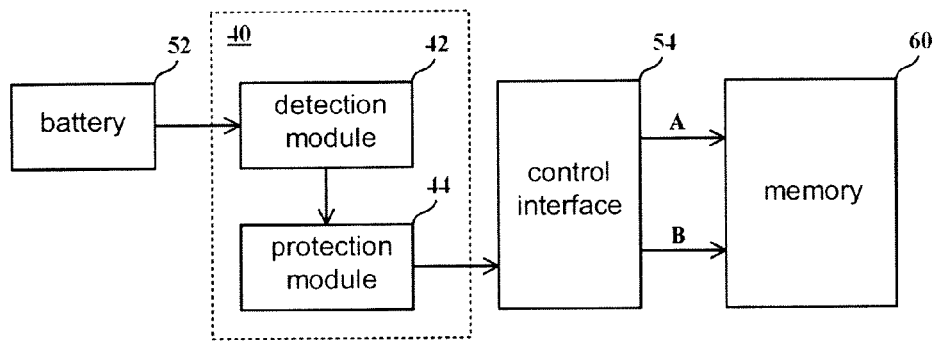
FIG. 4 is a block diagram of a memory controller and associated circuits according to an embodiment of the present invention.

FIG. 4 shows a block diagram and associated peripheral circuits of a memory controller according to an embodiment of the present invention. In this embodiment, a memory controller 40 comprises a detection module 42 and a protection module 44. The detection module 42 is coupled to a battery 52 of an electronic device associated with the memory 60. As shown in FIG. 4, the memory 60 comprises a command transmission port A and a data transmission port B, both connected to the electronic device and a control interface 54 for communicating with the memory 60. Once the detection module 42 detects an error condition in an output voltage of the battery 52 (e.g., the output voltage is lower than a threshold for a predetermined period), the protection module 44 sends an interrupt command via the control interface 54 and the command transmission port A to the memory 60, so as to command the memory 60 to stop an operation associated with the data transmission port B.

In practice, the detection module 42 and the protection module 44 in the controller 40 may be integrated into the control interface 54 of the electronic device. It is to be noted that a detection target of the detection module 42 is not limited to the output voltage of the battery 52; the detection module 42 may also be connected to other modules of the electronic device to detect other abnormalities. Furthermore, the control method illustrated in FIG. 1 to FIG. 3 may be realized by the hardware structure shown in FIG. 4. For example, when the detection module 42 discovers an abnormal output voltage of the battery 52, the protection module 44 may further determine whether an operation associated with the data transmission port B is under execution. Only when a determination result of the protection module 44 is affirmative, does the protection module 44 then send the interrupt command via the command transmission port A to the memory 60.

In conclusion, when an error condition occurs, the controlling method and controller of the present invention immediately notify the memory to stop operations associated with the data transmission port of the memory, such as reading and writing, so as to reduce or even completely prevent data damage (e.g., user data damage or memory system file damage) resulting from the error condition, and therefore optimize reliability of an electronic device and the memory card. Different from solutions provided by the prior art that implement remedial measures after data is already damaged, the controlling method and memory controller of the present invention aims to prevent or reduce the possibility of damage to the data.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory controlling method, for controlling a memory comprising a command transmission port and a data transmission port, the method comprising:
    detecting whether an error condition occurs in an electronic device associated with the memory the electronic device, including confirming the error condition according to a debounce condition; and
    sending an interrupt command to the memory via the command transmission port when the error condition is detected, for stopping an operation of the memory associated with the data transmission port.

2. The method according to claim 1, further comprising repeating the detecting step when it is determined that the error condition does not occur.

3. The method according to claim 1, wherein the error condition is a voltage failure or a system crash.

4. The method according to claim 1, wherein the memory is a secure digital (SD) card.

5. The method according to claim 1, wherein the debounce condition is associated with a power supply feature of the electronic device.

6. The method according to claim 1, wherein the sending the interrupt command step comprises:
    determining when to send the interrupt command at a sending time via the command transmission port.

7. The method according to claim 1, wherein the interrupt command is a stop reading/writing command or a memory stop command.

8. The method according to claim 1, wherein the detecting step further comprises:
    determining whether the operation associated with the data transmission port is under execution; and
    determining the error condition occurs when it is determined that the operation associated with the data transmission port is under execution.

9. The method according to claim 8, further comprising:
    determining the error condition occurs when it is determined that the operation associated with the data transmission port is not under execution.

10. A memory controller, for controlling a memory comprising a command transmission port and a data transmission port different from the command transmission port, the controller comprising:
    a detection module, for detecting an error condition in an electronic device associated with the memory, the detection module being configured to confirm the error condition according to a debounce condition; and
    a protection module, coupled to the detection module, for sending an interrupt command to the memory via the command transmission port of the memory, so as to stop an operation of the memory associated with the data transmission port in response to the error condition.

11. The memory controller according to claim 10, wherein the error condition is a voltage interrupt or a system crash.

12. The memory controller according to claim 10, wherein the memory is a secure digital (SD) card.

13. The memory controller according to claim 10, wherein the debounce condition is associated with a power supply feature of the electronic device.

14. The memory controller according to claim 10, wherein when the detection module detects the error condition, the protection module determines when to send the interrupt command at a sending time via the command transmission port.

15. The memory controller according to claim 10, wherein the interrupt command is a stop reading/writing command or a memory stop command.

16. The memory controller according to claim 10, wherein the detection module is a voltage detector or a mechanical sensor.

17. A memory controller, operative with a memory comprising a command transmission port and a data transmission different from the command transmission port, the controller comprising:
- a detection module, for detecting whether an error condition occurs in an electronic device associated with the memory, and for confirming the error condition according to a debounce condition; and
- a protection module, for determining whether an operation associated with the data transmission port is being performed when the detection module detects the error condition, and when it is determined that the operation is being performed, sending an interrupt command to the memory via the command transmission port to stop the operation of the memory associated with the data transmission port.

* * * * *